US006794883B2

(12) United States Patent
Klingel

(10) Patent No.: US 6,794,883 B2
(45) Date of Patent: Sep. 21, 2004

(54) METHOD AND SYSTEM FOR MONITORING WINDING INSULATION RESISTANCE

(75) Inventor: John C. Klingel, N. Mankato, MN (US)

(73) Assignee: Emerson Electric Co., St. Louis, MO (US)

( * ) Notice: Subject to any disclaimer, the term of this patent is extended or adjusted under 35 U.S.C. 154(b) by 0 days.

(21) Appl. No.: 10/249,067

(22) Filed: Mar. 13, 2003

(65) Prior Publication Data

US 2003/0178999 A1 Sep. 25, 2003

Related U.S. Application Data

(60) Provisional application No. 60/365,971, filed on Mar. 19, 2002.

(51) Int. Cl.[7] .............................................. G01R 31/08
(52) U.S. Cl. ....................... 324/522; 324/523; 324/524; 324/551; 702/58
(58) Field of Search ................................ 324/522, 509, 324/510, 772, 545, 546, 551, 705, 713, 523–524; 361/20, 23, 42; 702/57–59, 65

(56) References Cited

U.S. PATENT DOCUMENTS

| | | | | |
|---|---|---|---|---|
| 3,593,123 A | * | 7/1971 | Williamson et al. | ......... 324/545 |
| 3,746,979 A | * | 7/1973 | Kildishev et al. | ............ 324/545 |
| 4,408,157 A | * | 10/1983 | Beaubien | ...................... 324/712 |
| 4,542,468 A | | 9/1985 | Taniguti | ....................... 702/58 |
| 4,551,811 A | | 11/1985 | Taniguti | ....................... 702/58 |
| 4,556,946 A | * | 12/1985 | Taniguti | ....................... 702/58 |
| 4,766,387 A | * | 8/1988 | Browne et al. | .............. 324/545 |
| 4,812,751 A | * | 3/1989 | Roberts et al. | .............. 324/546 |
| 5,172,289 A | | 12/1992 | Zelm | ............................ 361/23 |
| 6,300,771 B1 | | 10/2001 | Goshima | ...................... 324/550 |

OTHER PUBLICATIONS

Burnley et al. "An improved method for estimating the insulation resistance of generator stators with cooling in water in–situ" Dielectric Materials, Measurements and Applications, Fifth International Conference, Jun. 27–30, 1998 pp. :301–304.*

* cited by examiner

*Primary Examiner*—Anjan K. Deb
(74) *Attorney, Agent, or Firm*—Howrey Simon Arnold & White LLP

(57) ABSTRACT

A method and system for determining the resistance of a winding insulation. The method includes applying a pulsed voltage having a maximum value and a minimum value to the winding insulation. The maximum and minimum values of the pulsed voltage are both negative values in certain exemplary implementations. The values of the maximum and minimum current flowing through the winding insulation are determined, and the winding insulation resistance is calculated based on the difference between the maximum and minimum current. A ground fault may be detected based on the calculated winding insulation resistance. The winding insulation monitoring system includes a sense resistor connected to the winding insulation and a pulsed voltage source is coupled to the sense resistor to apply the pulsed voltage to the winding insulation via the sense resistor. A processing device has input terminals coupled to the sense resistor and is programmed to determine the resistance of the winding insulation, which may include calculating the difference between the minimum and maximum current flowing through the sense resistor.

18 Claims, 3 Drawing Sheets

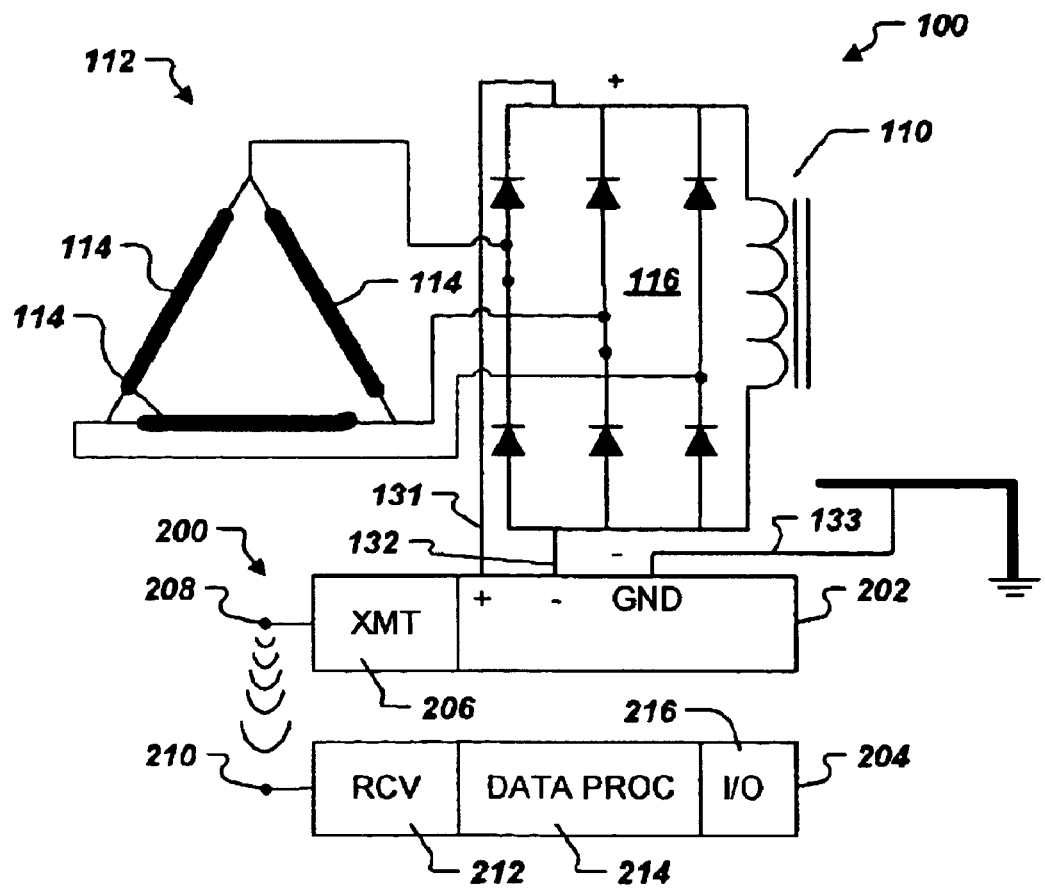
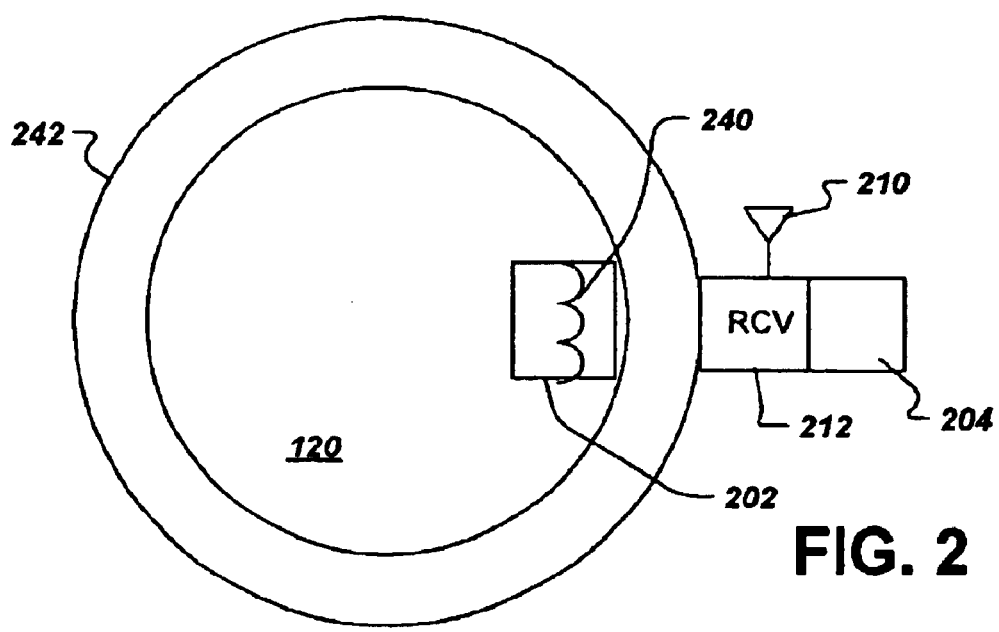

METHOD AND SYSTEM FOR MONITORING WINDING INSULATION RESISTANCE

CROSS REFERENCE TO RELATED APPLICATIONS

This application claims the benefit of U.S. Provisional Application No. 60/365,971, filed on Mar. 19, 2002, which is incorporated by reference herein.

BACKGROUND OF THE INVENTION

1. Field of the Invention

The present invention relates generally to rotating electromagnetic machines such as generators and synchronous motors, and more particularly, to a system and method for monitoring the insulation resistance of a machine winding.

2. Description of Related Art

In large rotating electromagnetic machines, a rotor winding, which is isolated from ground, is supplied with a current from an exciter. The rotor itself is grounded, and the rotor winding is encased by insulation such that it is electrically isolated from the rotor. Ground faults, however, sometimes occur. For example, the resistance of the winding insulation to ground may decrease to an extent that produces a low resistance path between the rotor winding and ground. Such insulation faults can result in damage to the rotor. Accordingly, large rotating electromagnetic machines are typically equipped with ground detection systems that monitor the rotor winding insulation. Often, an alarm is activated when an insulation fault is detected so the machine may be shut down and repairs made.

Several shortcomings exist with known rotor winding insulation monitoring systems, however. For example, prior art systems typically only provide a binary indication of the ground fault the alarm is simply activated upon detection of a fault. There is no resistance measurement to give an operator an indication of an impending fault, allowing a repair before a damaging fault occurs. Many prior art systems are prone to false alarms, which can result in significant costs when the machine, such as a large generator, is shut down unnecessarily.

The present invention is directed to overcoming, or at least reducing the effects of, one or more of the problems set forth above.

SUMMARY OF THE INVENTION

In one aspect of the invention, a method of determining the resistance of a winding insulation includes applying a pulsed voltage having a maximum value and a minimum value to the winding insulation. The values of the maximum and minimum current flowing through the winding insulation are determined, and the winding insulation resistance is calculated based on the difference between the maximum and minimum current. A ground fault may be detected based on the calculated winding insulation resistance. In exemplary implementations of the method, determining the maximum and minimum current flowing through the winding insulation includes calculating the current flowing through a sense resistor coupled in series with the winding insulation. Additionally, in exemplary embodiments, the pulsed voltage maximum value and minimum value both are negative values with respect to the winding negative terminal.

In other aspects of the invention, a winding insulation monitoring system includes a sense resistor connected to the winding insulation and a pulsed voltage source is coupled to the sense resistor to apply a pulsed voltage having maximum and minimum values to the winding insulation via the sense resistor. A processing device has input terminals coupled to the sense resistor and is programmed to determine the resistance of the winding insulation. This may include calculating the difference between the minimum and maximum current flowing through the sense resistor. In certain exemplary embodiments, the maximum and minimum values of the pulsed voltage are both negative values.

In accordance with still further aspects of the invention, a generator system employing a winding insulation monitor is disclosed The generator system includes a rotor with a field winding situated therein. Insulation isolates the field winding from the rotor. An exciter circuit is connected to the field winding. The winding insulation monitor includes a stationary portion having a receive antenna and an inductive loop coupled to a power source. A rotating portion is mounted to rotate with the rotorand includes a sense resistor connected to the winding insulation, a processing device having input terminals coupled to the sense resistor, a transmit antenna connected to an output terminal of the processing device, and a pick up coil for inductive coupling with the inductive loop to power the rotating portion.

A pulsed voltage having maximum and minimum values is applied to the winding insulation via the sense resistor, and the processing device determines the resistance of the winding insulation based on the pulsed voltage. As noted above, the maximum and minimum values of the pulsed voltage are both negative values in exemplary embodiments of the invention. To determine the resistance of the field winding, the processor may be programmed to calculate the current flowing through the sense resistor.

BRIEF DESCRIPTION OF DRAWINGS

Other objects and advantages of the invention will become apparent upon reading the following detailed description and upon reference to the drawings in which:

FIG. 1 is a block diagram schematically illustrating a generator system including a rotor winding insulation monitor in accordance with embodiments of the present invention.

FIG. 2 is a block diagram conceptually illustrating other aspects of the system shown in FIG. 1.

Figure 3:
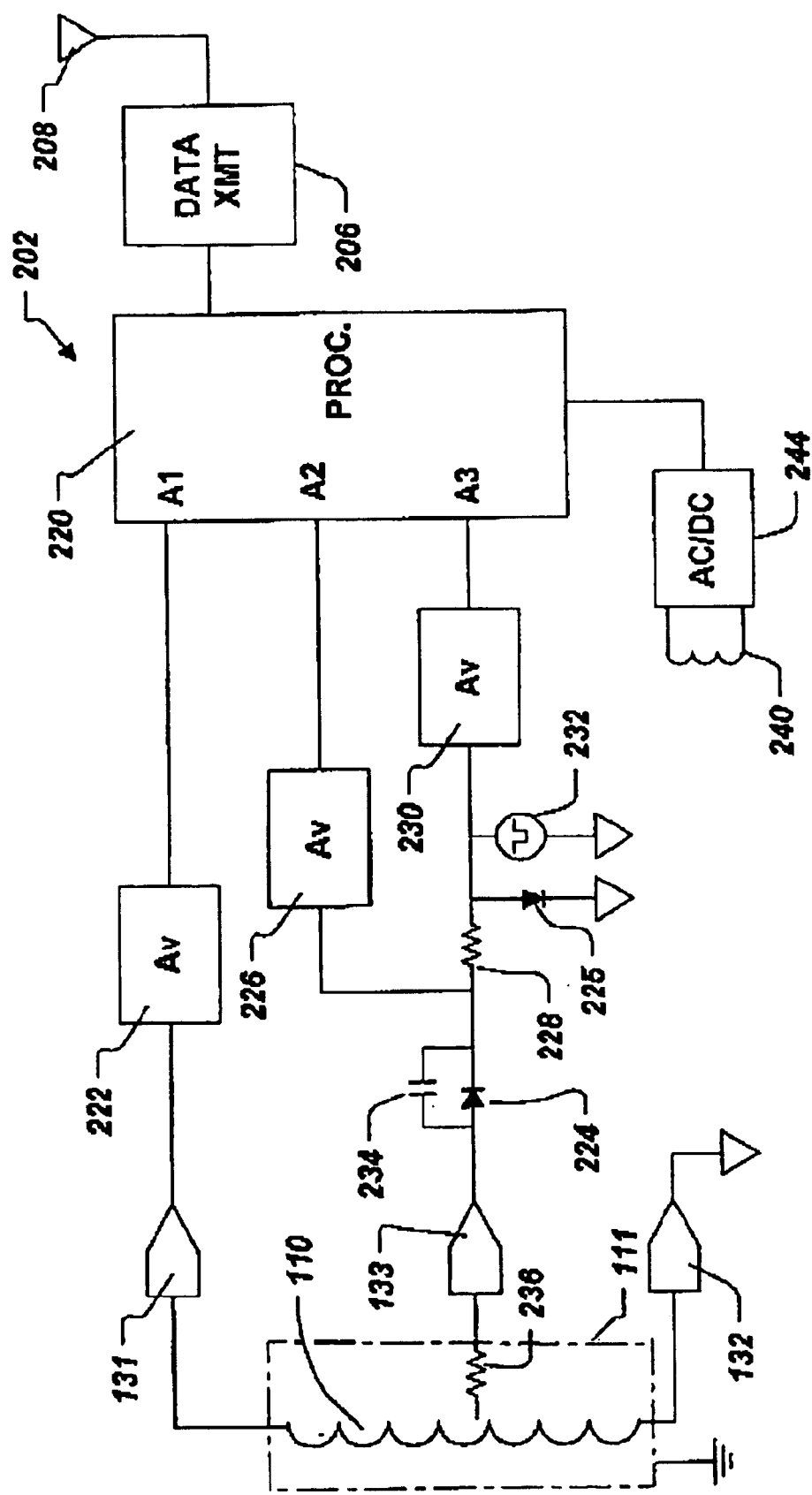
FIG. 3 illustrates portions of the rotor-mounted portion of the system shown in FIGS. 1 and 2.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers" specific goals, such as compliance with system-related and businessrelated constraints, which will vary from one implementation to another. Moreover, it will be appreciated that such a development effort might be complex and time-consuming, but would nevertheless be a routine undertaking for those of ordinary skill in the art having the benefit of this disclosure.

FIG. 1 is a block diagram conceptually illustrating portions of a generator system 100 employing a winding insulation monitoring system in accordance with aspects of the present invention. The generator system 100 includes a field winding 110 that is normally isolated from the rotor body by insulation (not shown). The generator field winding 110 is connected to positive and negative lines of an exciter circuit 112 that supplies a DC voltage across the winding 110. The exemplary exciter circuit 112 includes armature windings 114 connected to a diode bridge 116 such that a pulsed DC voltage is applied to the rotor winding 110.

The generator system 100 further includes a winding insulation monitoring system 200 that has a rotor-mounted portion 202 and a stationary portion 204. FIG. 2 conceptually illustrates the physical arrangement of the rotor-mounted and stationary portions 202, 204. The rotor-mounted portion 202 is connected to the rotor 120 so as to rotate therewith. A transmitter 206 sends data to the stationary portion 204 via a transmit antenna 208. The stationary portion 204 includes a receive antenna 210 connected to a receiver 212. The exemplary stationary portion 204 further includes a data processing section 214 and an I/O section 216 for connecting to an external control system. The positive and negative lines 131, 132 of the generator field winding 110, as well as the rotor earth ground terminal 133 are connected to respective inputs of the rotor-mounted portion 202.

FIG. 3 illustrates further aspects of the rotor-mounted portion 202 in accordance with an embodiment of the present invention. A signal processing device 220, such as an analog or digital signal processor (DSP), microcontroller or microprocessor includes input terminals and an output connected to the transmitter 206. A suitable processing device 220 is a model MSP430 signal processor available from Texas Instruments. The generator field positive line 131 is connected to input A1 via an amplifier 222. The rotor earth ground 133 is connected to input A2 via a blocking diode 224 and an amplifier 226. The blocking diode 224 allows megger testing without disconnecting the monitoring system. The rotor earth ground 133 is also connected to input A3 via the blocking diode 224, a sense resistor 228 and an amplifier 230. A diode 225 is connected between the sense resistor 228 and the negative generator field line, or common 132.

A pulsed voltage 232 is applied to input A3 via the amplifier 230. In the illustrated exemplary embodiment, the voltage pulse varies between −1.5 and −17 volts, though this may vary due to power supply coupling variations. Applying negative voltage pulses insures that the earth ground potential 133 is never negative with respect to the winding negative 132, and thus, the diode 224 is biased to remain in a continuous conduction mode. A capacitor 234 is coupled across the diode 224 to insure that the diode 224 remains in a conducting state. The frequency of the pulsed voltage 232 may be tuned to match the parasitic generator field capacitance to increase the measurement speed and accuracy.

The rotor-mounted portion 202 has a pickup coil 240 connected to an AC/DC converter 244. The rotor-mounted portion 202 is powered using inductive coupling. Power is transferred from an inductive loop 242 to the pick up coil 240. The rotor monitoring system 200 monitors the resistance of the winding insulation 111. The winding insulation resistance is conceptually shown as a resistor 236 in FIG. 3.

Figure 4:
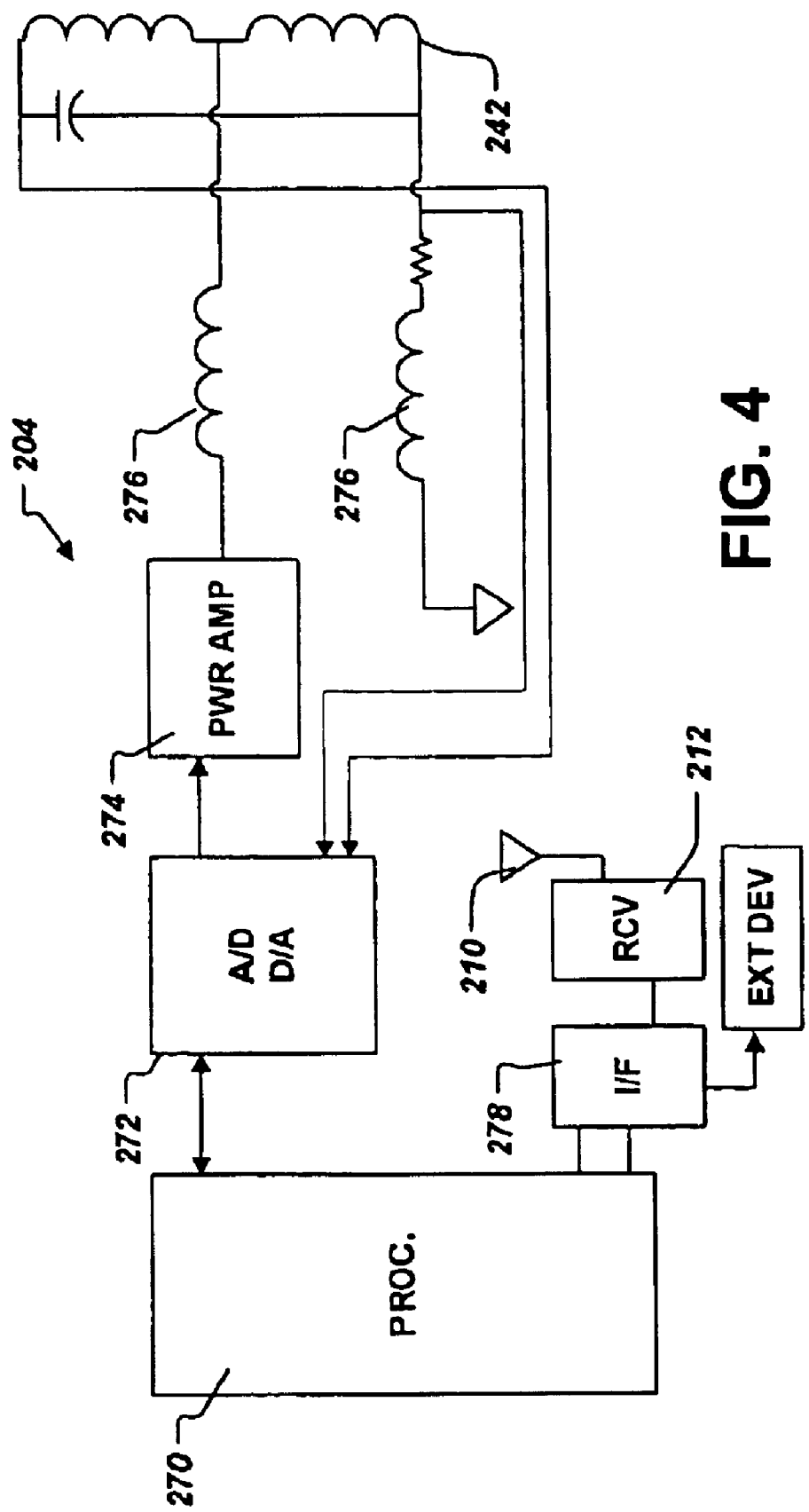
FIG. 4 illustrates portions of the stationary portion of the system shown in FIGS. 1 and 2.

FIG. 4 is a block diagram generally illustrating the stationary portion 204 of the monitoring system 200. The stationary portion 204 includes a signal processing device 270, such as an analog or digital signal processor (DSP), microcontroller or microprocessor. A suitable processing device 270 is a Motorola 56000 series DSP. The DSP 270 is connected to the inductive loop 242 via an A/D converter 272 and a power amp 274. As noted above, in other embodiments, the inductive loop 242 functions both as the power source for the rotor-mounted portion 202 using inductive coupling with the pickup coil 240 and as a receive antenna to receive data from the rotor-mounted portion 204, eliminating the need for the separate receive antenna 210. Ferrite beads 276 are used to control the RF impedance.

The RF receiver 212 receives data from the rotor mounted transmitter 206, which is passed on to the processor 270 via an interface port 278. The interface port 278 also provides a means to communicate received data or other system operating conditions to an external computer or other control system for system monitoring, control, protection, etc.

As noted above, the monitoring system 200 monitors the resistance of the winding insulation to determine if the resistance of the winding insulation to ground has decreased to an extent that produces a low resistance path between the rotor winding and ground. The pulsed voltage 232 is used to determine the resistance of the winding insulation for this purpose. In certain embodiments of the present invention, the current levels associated with the pulsed voltage 232 are calculated and monitored to determine the insulation resistance.

Calculating the insulation resistance using the difference between the pulsed values allows one to extract the true insulation resistance to ground in the presence of high rotor winding potentials. Known methods may not measure true resistance to ground because the imposed winding potentials cause currents to flow in the sense resistor that are not due to the insulation monitor's bias voltage source. Thus, such insulation monitors will likely measure an artificially low insulation resistance.

As shown in FIG. 3, the sense resistor 228 is connected in series with the winding insulation 236. Since the value of the sense resistor 228 ($R_{sense}$) is known, the resistance of the insulation 111 can be determined by calculating the combined resistance of the series-connected sense resistor 228 and the insulation resistance, then subtracting the known sense resistance. The high and low values of the voltage pulses 232 ($V_1$ and $V_2$) are also known (as noted above, in one embodiment the pulses vary between −1.5 and −17 volts). The current levels ($I_1$ and $I_2$) associated with the pulsed voltage levels are determined by comparing the voltage levels at inputs A3 and A2 of the processor 220 for the high and low values of the voltage pulses 232. The voltage levels at input A2 are referred to as the ground detect voltages $V_{G1}$ and $V_{G2}$. Thus, the corresponding current values $I_1$ and $I_2$ are calcuited as follows:

$$I_1 = \frac{V_1 - V_{G1}}{R_{sense}}$$

$$I_2 = \frac{V_2 - V_{G2}}{R_{sense}}$$

The differences between the high and low voltage and current levels (ΔV and ΔI) are then used to calculate the resistance of the winding insulation 111, represented by the resistor 236 ($R_{GF}$):

$$\Delta V = V_1 - V_2$$

$$\Delta I = I_1 - I_2$$

$$R_{GF} = \frac{\Delta V}{\Delta I} - R_{sense}$$

If the calculated insulation resistance level indicates a ground fault, comparing the generator main field 131 and the winding insulation 111 voltage levels (inputs A1 and A2 of the processing device 220) can provide an indication of the relative location of the fault.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown. It is therefore evident that the particular embodiments disclosed above may be altered or modified and all such variations are considered within the scope and spirit of the invention.

What is claimed is:

1. A method of determining the resistance of a winding insulation, comprising:
    applying a pulsed voltage having a maximum value and a minimum value to the winding insulation, wherein the maximum and minimum values are both negative values with respect to the winding negative;
    determining the maximum current flowing through the winding insulation corresponding to the maximum value of the pulsed voltage;
    determining the minimum current flowing through the winding insulation corresponding to the minimum of the pulsed voltage;
    determining the difference between the maximum and minimum current; and
    calculating the winding insulation resistance based on the difference between the maximum and minimum current.

2. The method of claim 1, further comprising detecting a ground fault based on the calculated winding insulation resistance.

3. The method of claim 2, wherein the winding is a generator field winding, the method further comprising determining the winding insulation voltage, and comparing the winding insulation voltage to the generator field winding voltage to determine the relative location of a ground fault.

4. The method of claim 1, wherein applying the pulsed voltage includes applying the pulsed voltage to a acme resistor connected in series with the insulation.

5. The method of claim 4, wherein determining the maximum and minimum current flowing through the winding insulation includes calculating the current flowing through the sense resistor corresponding to maximum and minimum voltage values, respectively.

6. A winding insulation monitoring system, comprising:
    a sense resistor connected to the winding insulation;
    a pulsed voltage source coupled to the sense resistor to apply a pulsed voltage having maximum and minimum values to the winding insulation via the sense resistor, wherein the maximum and minimum values or the pulsed voltage are both negative values; and
    a processing device having input terminals coupled to the sense resistor, the processing device programmed to determine the resistance of the winding insulation based on the minimum and maximum values of the pulsed voltage.

7. The monitoring system of claim 6, further comprising a diode connected in series between the winding insulation and the sense resistor.

8. The monitoring system of claim 6, further comprising a diode connected in series between the sense resistor and a circuit common.

9. The monitoring system of claim 6, wherein the processor is programmed to calculate the current flowing through the sense resistor.

10. The monitoring system of claim 6, wherein the winding is a rotor winding, and wherein the monitoring system includes a stationary portion and a rotating portion mounted to rotate with the rotor.

11. The monitoring system of claim 10, wherein the rotating portion includes the processor and sense resistor.

12. The monitoring system of claim 10, further comprising a transmitter and a transmit antenna connected to an output terminal of the processor.

13. The monitoring system of claim 12, wherein the stationary portion includes a receive antenna for receiving data from the transmit antenna.

14. The monitoring system of claim 13, wherein:
    the stationary portion includes an inductive loop connected to a power source; and
    the rotating portion includes a pick up coil connected to the processor.

15. A generator system, comprising:
    a rotor;
    a field winding situated in the rotor;
    insulation isolating the field winding from the rotor,
    an exciter circuit connected to the field winding, and
    a winding insulation monitor, including:
        a stationary portion including a receive antenna and an inductive loop coupled to a power source; and
        a rotating portion mounted to rotate with the rotor, the rotating portion including a sense resistor connected to the winding insulation, a processing device having input terminals coupled to the sense resistor, a transmit antenna connected to an output terminal of the processing device, and a pick up coil for inductive coupling with the inductive loop to power the rotating portion;
        wherein a pulsed voltage having maximum and minimum values is applied to the winding insulation via the sense resistor, the maximum and minimum values both being negative values with respect to the winding negative, and wherein the processing device is programmed to determine the resistance of the winding insulation based on the minimum and maximum values of the pulsed voltage.

16. The generator system of claim 15, wherein processor is programmed to calculate the current flowing through the sense resistor.

17. The generator system of claim 15, further comprising a diode connected in series between the winding insulation and the sense resistor.

18. The generator system of claim 15, further comprising a diode connected in series between the sense resistor and a circuit common.

* * * * *

UNITED STATES PATENT AND TRADEMARK OFFICE
CERTIFICATE OF CORRECTION

PATENT NO. : 6,794,883 B2
DATED : September 21, 2004
INVENTOR(S) : John C. Klingel It is certified that error appears in the above-identified patent and that said Letters Patent is hereby corrected as shown below:

Column 5,
Line 51, replace "acme" with -- sense --;

Column 6,
Line 56, replace beginning with "16. The generator" to and including "processor" with -- 16. The generator system of claim 15, wherein the processor --.

Signed and Sealed this

Twenty-seventh Day of September, 2005

JON W. DUDAS
*Director of the United States Patent and Trademark Office*